United States Patent
Brask et al.

(10) Patent No.: US 6,797,622 B2
(45) Date of Patent: Sep. 28, 2004

(54) SELECTIVE ETCHING OF POLYSILICON

(75) Inventors: Justin K. Brask, Portland, OR (US); Steven J. Keating, Beaverton, OR (US); Mark L. Doczy, Beaverton, OR (US); Travis J. Delashmutt, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 10/210,461

(22) Filed: Jul. 31, 2002

(65) Prior Publication Data

US 2004/0023477 A1 Feb. 5, 2004

(51) Int. Cl.[7] ............................................. H01L 21/302
(52) U.S. Cl. ........................ 438/689; 430/296; 430/313
(58) Field of Search ................................. 430/296, 313; 438/689

(56) References Cited

U.S. PATENT DOCUMENTS

| 5,674,758 | A | * | 10/1997 | McCarthy | 438/26 |
| 6,261,978 | B1 | * | 7/2001 | Chen et al. | 438/224 |
| 6,303,418 | B1 | * | 10/2001 | Cha et al. | 438/199 |
| 6,358,670 | B1 | * | 3/2002 | Wong et al. | 430/296 |

* cited by examiner

Primary Examiner—John F. Niebling
Assistant Examiner—Olivia T Luk
(74) Attorney, Agent, or Firm—Trop, Pruner & Hu, P.C.

(57) ABSTRACT

Polysilicon formed over an underlying insulator may be highly selectively etched. This may permit the replacement of polysilicon gate electrode material, implementing a dual layer process or any of a variety of other applications.

21 Claims, 2 Drawing Sheets

SELECTIVE ETCHING OF POLYSILICON

BACKGROUND

This invention relates generally to selectively etching polysilicon with respect to other materials including insulators such as oxide or nitride insulators.

In a variety of different circumstances, it may be desirable to etch polysilicon selectively. That is, it may be desirable to preferentially etch polysilicon while reducing the etching of other materials such as insulators.

One example of a situation where such selectivity may be desirable is in connection with providing dual metal gate technology. Dual polysilicon gates are used in conventional complementary metal oxide semiconductor (CMOS) devices to engineer a desired threshold voltage that may be different between the NMOS and PMOS devices. Unfortunately, as the device's scale becomes smaller, this approach is not effective. When the polysilicon doping level is not sufficiently high, the polysilicon gate depletion effectively increases the gate dielectric thickness by several Angstroms. This negatively impacts the ability to scale gate dielectric thicknesses. Boron penetration and gate resistance may also be issues for such polysilicon gate technology.

One approach to this problem is to replace the polysilicon gate with a metal gate. More particularly, one metal gate may be utilized for the NMOS devices and a different metal gate may be utilized for the PMOS devices.

Thus, it may be desirable to form dual metal gate technology from conventional processing steps that use polysilicon. After the polysilicon has been defined to form the gate electrodes for a transistor, the polysilicon may be selectively removed. A different metal may be applied to form each of the NMOS and PMOS transistors.

Thus, there is a need for a better way to selectively etch polysilicon with respect to other materials.

DETAILED DESCRIPTION

Figure 1:
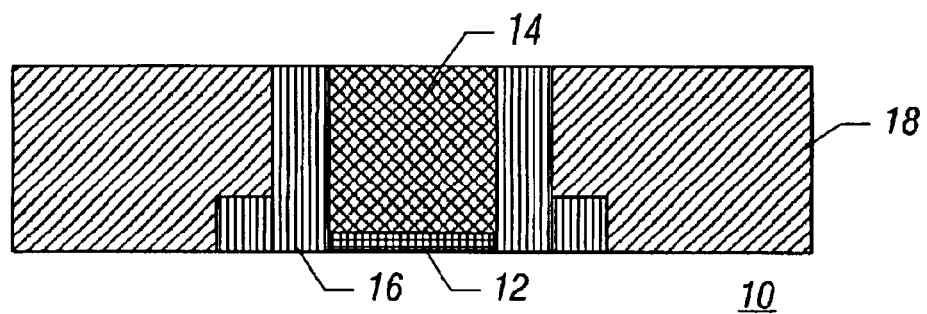
FIG. 1 is an enlarged cross-sectional view of one embodiment of the present invention at an earlier stage of manufacture.

Referring to FIG. 1, a conventional NMOS or PMOS transistor may be formed on a semiconductor structure 10. The transistor may include a polysilicon gate 14 over a gate dielectric 12. A nitride spacer 16 may be formed on the sidewalls of the gate electrode 14 and an interlayer dielectric 18 may be situated over the structure 10 outside of the spacer 16 in one embodiment.

To implement a dual metal complementary metal oxide semiconductor device, it is desirable to remove the polysilicon gate 14 and to selectively replace it with another metal. In one embodiment of the present invention the NMOS and PMOS transistors may receive different gate metal material.

Figure 2:
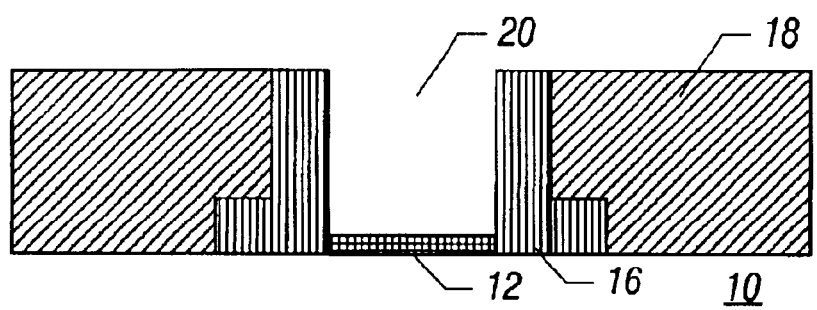
FIG. 2 is an enlarged cross-sectional view of the embodiment shown in FIG. 1 after further processing in one embodiment.

Referring to FIG. 2, the polysilicon gate 14 has been removed by a selective etch which is highly selective of interlayer dielectrics, nitride spacers, metal gates, and underlying gate oxides, as well as silicon or other high dielectric constant materials, to mention a number of examples. The selective removal of the polysilicon gate 14 may involve using a 25 percent solution of tetramethylammonium hydroxide (TMAH) in one embodiment. In another embodiment tetraethylammonium hydroxide or another tetra(alkyl) ammonium hydroxide may be used. This etch is particularly selective of p-type doped polysilicon gate material but may also be utilized in connection with n-type doped polysilicon gate material. Thus, this embodiment is particularly applicable to removing the polysilicon gate on the PMOS transistors, but is also applicable to removing the polysilicon gate of NMOS transistors. The etch may have a linear etch rate of 100 Angstroms per minute in one embodiment.

Figure 3:
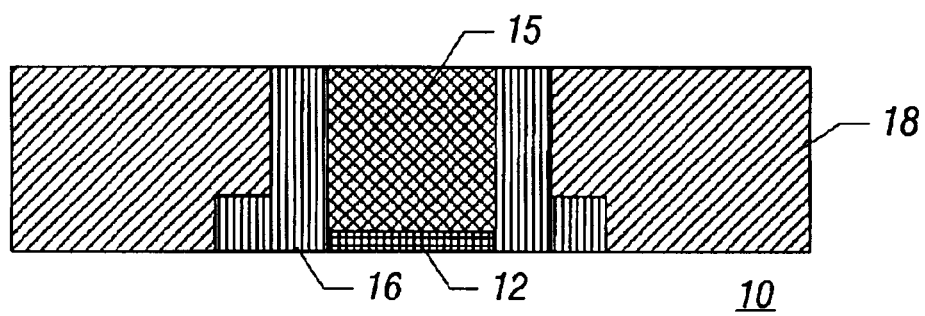
FIG. 3 is an enlarged cross-sectional view of the embodiment shown in FIG. 1 after further processing in one embodiment.

After the polysilicon gate 14 has been removed a new gate material 15, such as a metal gate material, may be formed or deposited into the void 20 in accordance with one embodiment of the present invention shown in FIG. 3.

In conventional processes for removing the doped polysilicon gate 14, generally additional steps may be necessary, for example, to replace the gate oxide which may be damaged or removed in the course of etching the overlying polysilicon gate 14. The additional steps may be disadvantageous in some embodiments because additional steps generally involve more expense and the regrown oxide may grow on the sidewalls of the nitride spacer 16.

Figure 4:
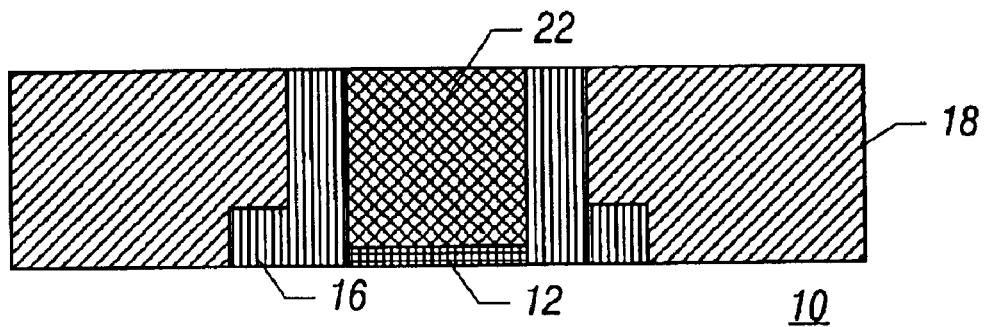
FIG. 4 is an enlarged cross-sectional view of another embodiment of the present invention.

Referring to FIG. 4, in accordance with another embodiment of the present invention, a transistor similar to the one shown in FIG. 1 may include a polysilicon gate 22. The gate 22 may be an n-type doped polysilicon material used, for example, to form the NMOS component of a CMOS transistor. The n-type doped polysilicon gate 22 may be selectively removed without damaging significantly the underlying gate oxide 12 by using $NH_4OH$ etch at 24° C. together with sonics in one embodiment. Thus, a room temperature etching process may be utilized with ultrasonic or megasonic energy.

Hydroxide-based etches of silicon are normally done at high temperatures which reduces the selectivity between the NMOS and the PMOS material. At low temperatures the $NH_4OH$ is ineffective since hydrogen gas bubble formation at the structure 10 generates a protective silicon-hydrogen coating that shuts down the etch. However, by sonicating the chemical bath, H2 bubble formation may be reduced or eliminated, dissipating the H2 into solution upon formation and allowing completion of the etch. At this low temperature, the p-type polysilicon gate 22 is not etched, enabling a highly selective etch for the n-type polysilicon gate 22.

Figure 5:
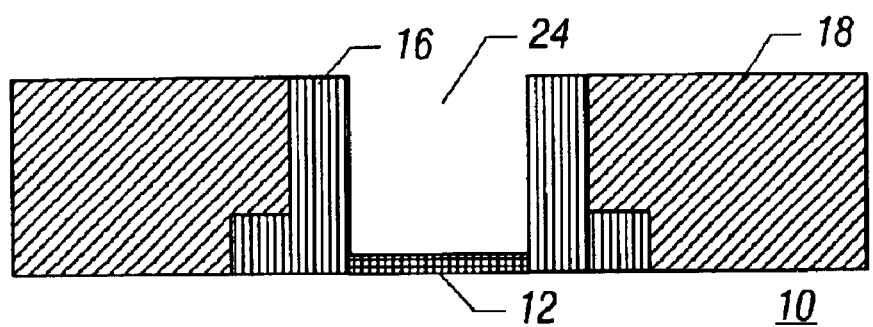
FIG. 5 is an enlarged cross-sectional view after further processing in one embodiment.
Figure 6:
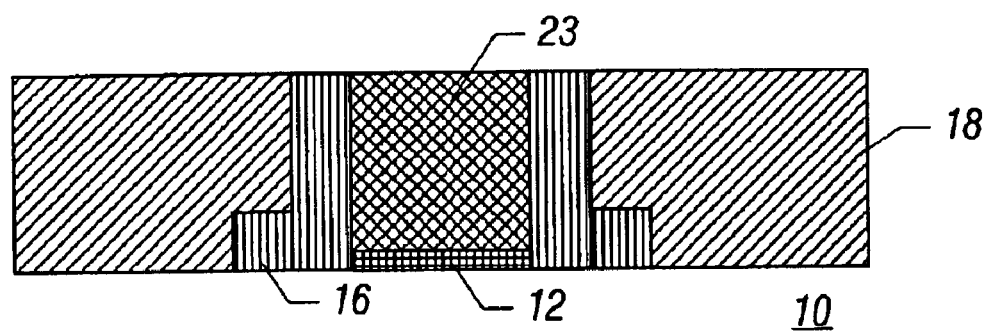
FIG. 6 is an enlarged cross-sectional view after further processing in one embodiment.

Thus, the resulting structure, shown in FIG. 5, has the n-type polysilicon 22 removed leaving an opening 24. However, the oxide 12 is not significantly affected. Thereafter, a metal gate 23 may be formed in the opening 24 as shown in FIG. 6.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming a structure with polysilicon over an insulator; and selectively etching the polysilicon with respect to the underlying insulator using a solution containing tetraalkylammonium hydroxide.

2. The method of claim 1 wherein forming a structure with polysilicon over an insulator includes forming a dual metal gate structure.

3. The method of claim 1 further including removing the polysilicon over the insulator and replacing the polysilicon with a metal.

4. The method of claim 1 including using a twenty-five percent solution of tetramethylammonium hydroxide.

5. The method of claim 1 including forming a structure with p-type doped polysilicon and selectively etching the p-typed doped polysilicon.

6. The method of claim 1 including forming a structure with p-type doped polysilicon over an insulator and n-type doped polysilicon over an insulator.

7. The method of claim 6 including removing said n-type doped polysilicon.

8. The method of claim 7 including after removing said n-type doped polysilicon removing said p-type doped polysilicon using said solution containing tetramethylammonium hydroxide.

9. The method of claim 8 including using $NH_4OH$ to remove said n-type doped polysilicon.

10. The method of claim 9 including using sonic energy to aid in removing said n-type doped polysilicon.

11. A method comprising:

forming a structure with polysilicon over an insulator;

selectively etching the polysilicon with respect to the underlying insulator using a solution containing $NH_4OH$; and applying sonic energy to said solution.

12. The method of claim 11 including forming a structure with n-type doped polysilicon over an insulator and selectively etching the n-type doped polysilicon with respect to the underlying insulator using a solution containing $NH_4OH$.

13. The method of claim 12 including forming a structure with n-type doped polysilicon and p-type doped polysilicon over an insulator and selectively etching the n-type doped polysilicon using $NH_4OH$.

14. The method of claim 1 including applying sonic energy to break up hydrogen gas bubble formations.

15. The method of claim 11 including using $NH_4OH$ at room temperature.

16. The method of claim 11 including using megasonic energy.

17. The method of claim 11 including using ultrasonic energy.

18. The method of claim 11 including replacing said etched polysilicon with a metal.

19. A method comprising:

forming a structure with n-type and p-type polysilicon over an insulator;

selectively etching the p-type polysilicon with respect to the underlying insulator using a solution containing tetraalkylammonium hydroxide; and selectively etching the n-type polysilicon using $NH_4OH$ to remove said n-type polysilicon.

20. The method of claim 19 including using sonics to aid in removing said n-type polysilicon.

21. The method of claim 19 including etching the p-type polysilicon with tetramethylammonium hydroxide.

* * * * *